United States Patent [19]
Chang et al.

[11] Patent Number: 5,345,073
[45] Date of Patent: Sep. 6, 1994

[54] VERY HIGH SPEED OPTICAL RECEIVER WITH A CASCADABLE DIFFERENTIAL ACTION FEEDBACK DRIVER

[75] Inventors: Gee-Kung Chang, Holmdel, N.J.; Ting P. Liu, Albany, Calif.

[73] Assignee: Bell Communications Research, Inc., Livingston, N.J.

[21] Appl. No.: 45,961

[22] Filed: Apr. 12, 1993

[51] Int. Cl.$^5$ ............................................. H01J 40/14
[52] U.S. Cl. ................................. 250/214 A; 330/260
[58] Field of Search ............... 250/214 R, 214 A, 551; 330/260, 308, 59

[56] References Cited

U.S. PATENT DOCUMENTS

| | | | |
|---|---|---|---|
| 4,853,530 | 8/1989 | Muto | 250/214 A |
| 5,045,807 | 9/1991 | Ishihara et al. | 330/260 |
| 5,053,718 | 10/1991 | Graeme et al. | 330/260 |
| 5,130,667 | 7/1992 | Chang et al. | 330/253 |

*Primary Examiner*—David C. Nelms
*Attorney, Agent, or Firm*—Leonard Charles Suchyta; Joseph Giordano

[57] ABSTRACT

Our invention is a differential transimpedance amplifier circuit with shunt-shunt local feedback gain stages. These shunt-shunt feedback gain stages comprise an additional resistor and two transistors in a shunt-shunt feedback configuration to provide a low output impedance while maintaining the transimpedance gain. Cascading circuits of this structure results in a high bandwidth receiver with sufficient gain to drive conventional data regeneration circuits.

11 Claims, 3 Drawing Sheets

VERY HIGH SPEED OPTICAL RECEIVER WITH A CASCADABLE DIFFERENTIAL ACTION FEEDBACK DRIVER

TECHNICAL FIELD OF THE INVENTION

This invention relates to wideband receiver circuits and more specifically, to a differential receiver amplifier with cascadable, integrated post amplifier stages for directly driving data regeneration circuits for use in very high speed fiber optic receiver systems.

BACKGROUND OF THE INVENTION

The demand for high-speed digital communications services, such as data, video, and high-definition TV, is growing. To accommodate these services transmission systems that operate in the multigigabit per second range are being developed with technologists concentrating on developing optical transmission systems because of their large bandwidth capabilities. Such high speed optical transmission systems require wide bandwidth receivers that are capable of receiving the optical signal and providing an electrical signal output. Transimpedance amplifiers are widely used in optical receiver applications as preamplifiers for converting received optical signals into an electrical signal output. However, the bandwidth performance of conventional transimpedance amplifier circuits is limited to a small fraction of the bandwidth of the embedded transistors because of the difficulty of achieving high gain at high frequencies.

To facilitate the discussion that follows, it is important to define two terms of art with regard to bandwidth performance. The first is the frequency where the signal response of the circuit or device drops by 3 dB below the mid-band frequency response; it is called the −3 dB bandwidth and is denoted as $f_{-3db}$. The second is the frequency where a transistor produces unity gain (0 dB); it is called the unity gain frequency and is denoted by $f_t$. For conventional transimpedance amplifiers, the $f_{-3db}$ is determined by the dominant pole defined by the relationship $1/(2\pi RC)$, where R is the effective value of the load resistance and C is the effective value of the input capacitance at the active transistor's base. The $f_{-3dB}$ of the circuit cannot be any larger than the $f_t$ of the embedded transistors and, in application, is usually lower than $f_t$ by at least a factor A (the open loop voltage gain). Therefore, to improve the bandwidth capability of conventional transimpedance amplifiers, developers have had to try to minimize R or C, or improve the technology of the embedded transistors used in the circuit. However, reducing the value of R increases the circuit's internal noise and reduces the gain in the circuit (the gain is defined as $i \times R$, where i is the photodiode current input at the base of the input transistor), thereby minimizing the effectiveness of the circuit's intended function.

U.S. Pat. No. 5,130,667, by G-K Chang, James L. Gimlett, and Ting-Ping Liu, entitled "Differential Transimpedance Amplifier", discloses a receiver amplifier that solves the problems identified above. The disclosed apparatus demonstrates that a circuit receiver front end can achieve high speed operation (greater than 10 Gb/s) and deliver the desirable differential output. It also has better noise performance at high bit rate operation because the noises from both the power supply lines and those picked up through RF antenna effect are common to both arms of the differential amplifier, thus the common mode noise rejection ratio can be high.

However, there is a second design objective for high speed optical receivers. Besides the need to be responsive to an input source operating at high frequencies, the receiver also must amplify the signal so that it has sufficient power to drive a data regeneration circuit at the next stage. The first step in that process is to increase the output voltage. In the Chang et al. patent the voltage at the output resistor is expressed by $$V_{out1} = i_{photo} \times R_1$$

and $$V_{out2} = \overline{V_{out1}}$$

where $i_{photo}$ is the photo current generated in the photodiode from incident optical power and $R_1$ is the load resistor. Therefore, to increase the output voltage, the value of the $R_1$ must be increased. However, because $R_1$ is also analogous to the feedback resistor for an amplifier circuit, an increase in the value of $R_1$ also increases the circuit gain thereby reducing the bandwidth capabilities of the circuit. Therefore, it is an objective of our invention to improve the frequency performance of the Chang et differential transimpedance amplifier circuit while also improving its gain.

SUMMARY OF THE INVENTION

Our invention replaces the load resistors in each current path of the Chang et al. differential amplifier circuit with a shunt-shunt feedback gain stage. This shunt-shunt feedback gain stage is comprised of a transistor and a resistor within a current path of the differential transimpedance amplifier replacing the original load resistor and connected in parallel with a second resistor and transistor connected in series and biased between the circuit's positive and negative D.C. voltage sources. The base of the second transistor is connected at a node located between the first resistor and the input transistor of the differential amplifier circuit. The base of the first transistor is connected at the connection node between the second resistor and the collector of the second transistor. The result is the separation of the functions of output drive impedance from the gain impedance. The output drive impedance can be kept low to achieve wide bandwidth while the gain impedance can be raised to provide sufficient signal gain.

A second aspect of our invention is to incorporate the inventive circuit with a cascadable multistage post amplifier, of the same structure of our inventive circuit to attain sufficient gain necessary to drive conventional data regeneration circuits.

DETAILED DESCRIPTION

Figure 1:
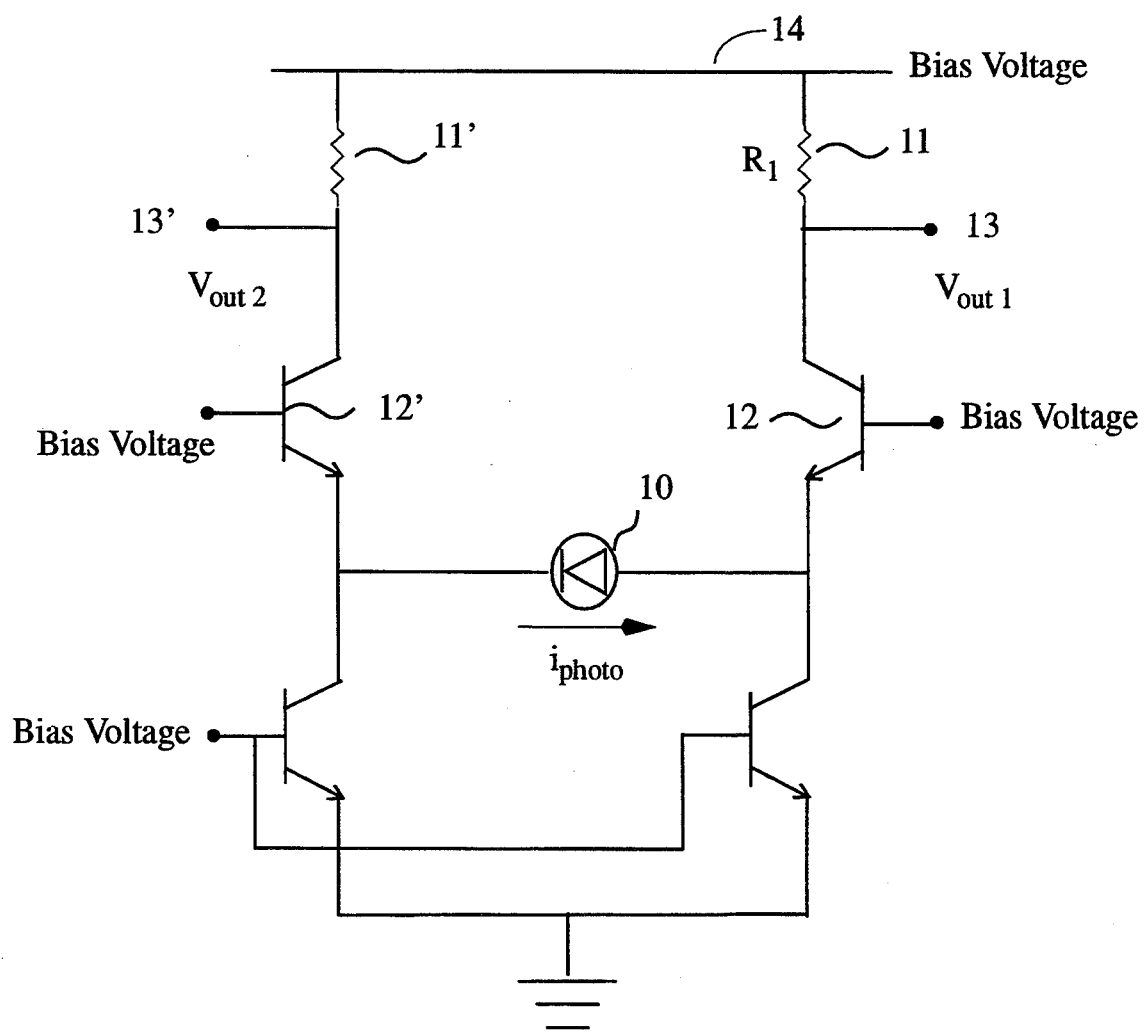
FIG. 1 depicts a differential transimpedance amplifier circuit as disclosed the Chang et al. patent.

FIG. 1 depicts our previously patented (Chang et al.) differential transimpedance amplifier circuit. In that circuit the output voltage at output terminal 13 is expressed by $$V_{out1} = i_{photo} \times R_1$$

and where $i_{photo}$ is the photo current generated in the photodiode 10 from incident optical power and where $R_1$ is the load resistor 11. The unity-gain frequency ($f_t$) of the input transistor 12 is expressed as $$f_t = \frac{g_m}{(2\pi C_{be})}$$

where $g_m$ is the transconductance of the transistor 12 and $C_{be}$ is the base emitter capacitance. The equivalent small signal $-3$ dB cut-off frequency of the front end of our circuit with a differential load, $C_{L,in}$, which equals two times the photodiode 10 capacitance, can be expressed as $$f_{-3dB} = \frac{g_m}{2\pi \times (C_{be} + C_{L,in})}$$

However, the circuit performance is also limited by its second pole as at the output node expressed by $$f_{-3dB} = \frac{1}{2\pi R(C_{bc} + C_{L,out})}$$

where R is the value of the output impedance which in this case is the value of the output resistor, where $C_{bc}$ is the base collector capacitance, and where $C_{L,out}$ is the loading capacitance are connected to and follow the output nodes. The effect of this second pole on the circuit is substantial. Our experimental attempts to improve the bandwidth performance by reducing $C_{L,out}$ evidenced this problem.

A more detailed analysis of the performance of circuit depicted in FIG. 1 shows that the bandwidth performance is dominated by two time constants $\tau_1$ and $\tau_2$. The time constant $\tau_1$ is associated with node 15 in FIG. 1 and is equal to $(1/g_m)(C_{be} + 2C_{diode})$ where $g_m = I_0/V_T$, and the time constant $\tau_2$ is associated with node 16 in FIG. 1 and is equal to $R_1(C_L + C_{bc})$ where $C_L$ is the load capacitance. The $-3$ dB cut-off frequency of the circuit as expressed using these time constants is $$f_{-3dB} = \frac{1}{2\pi(\tau_1 + \tau_2)} =$$

$$\frac{1}{2\pi \left( \frac{C_{be} + 2C_{diode}}{g_m} + R_1(C_L + C_{bc}) \right)}$$

The problem then is to reduce the value of $\tau_2$ without reducing the transimpedance gain which is determined by the value of $R_1$.

Figure 2:
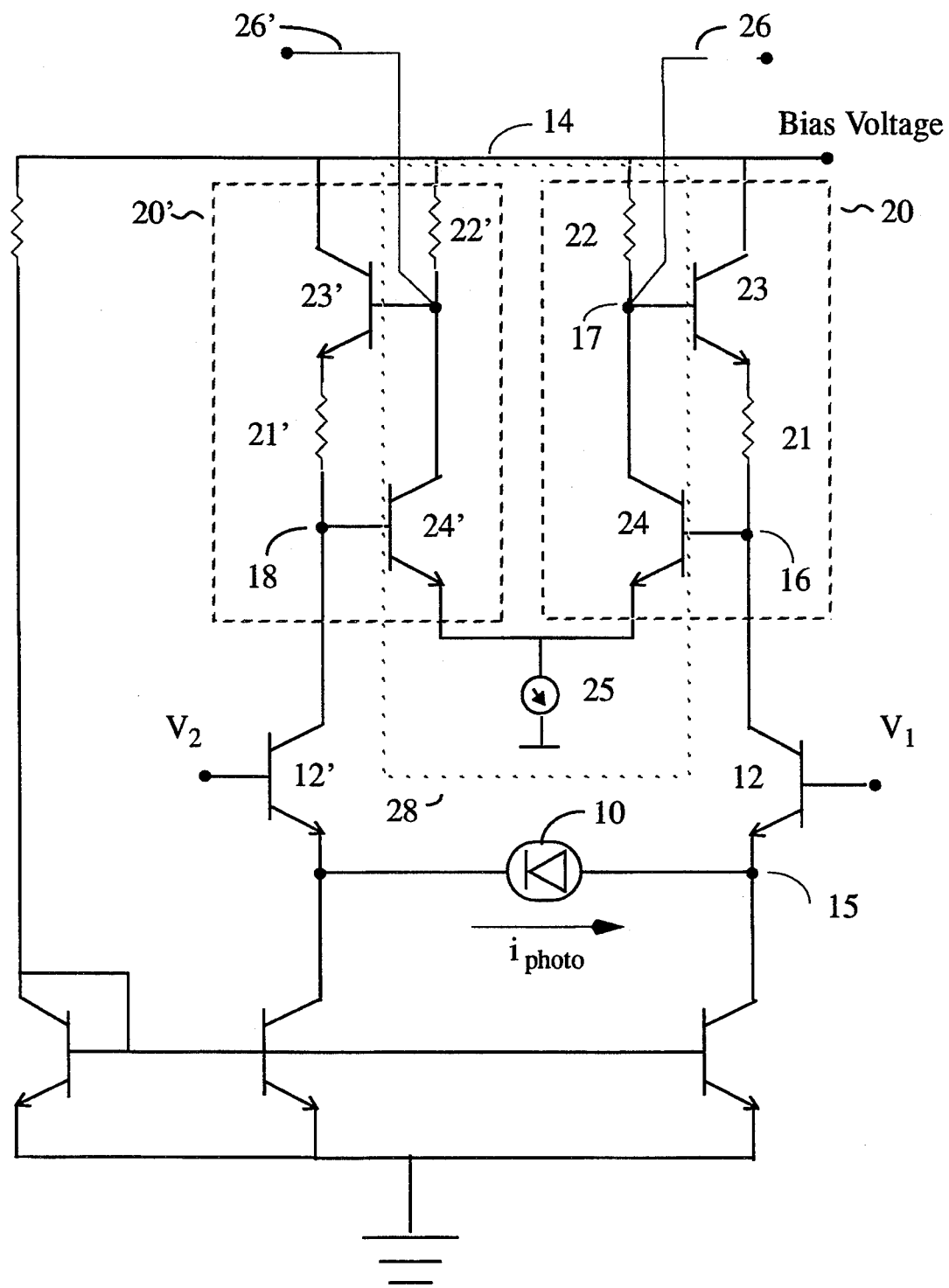
FIG. 2 depicts a differential transimpedance amplifier circuit incorporating a shunt-shunt feedback gain stage in accordance with one illustrative embodiment of our invention.

To solve the second pole problem our invention uses a shunt-shunt feedback gain circuit to replace the output load resistors. FIG. 2 depicts an illustrative embodiment of our differential feedback amplifier circuit with a shunt-shunt feedback gain circuit in place of the output load resistors. In this new circuit we separate the functions of transimpedance gain from output drive. Namely, one resistor 21 provides for the transimpedance gain while the impedance of the shunt-shunt feedback gain circuit provides the output drive load. In FIG. 2, the shunt-shunt feedback gain stages 20 and 20' are shown taking the place of the load resistors 11 and 11' from FIG. 1. The two shunt-shunt gain stages 20 and 20' are identical and are also combined in a differential amplifier structure 28 an overall differential feedback action driver function.

Shunt-shunt gain stage 20 is comprised of two resistors 21 and 22, and two transistors 23 and 24. The collector of transistor 23 is connected to the DC bias voltage source with its emitter connected to resistor 21 providing a current path from the DC bias voltage source through transistor 23 and resistor 21 to the collector of input transistor 12 of the differential transimpedance amplifier circuit. Resistor 22 is connected between the voltage source lead 14 and the collector of transistor 24. Transistor 24 establishes a current path from resistor 22 to a constant current source 25. The base of transistor 23 is connected between resistor 22 and transistor 24, and the base of transistor 24 is connected between resistor 21 and the input transistor 12. The consequence of the described configuration is that, as light energy is received by photodiode 10, it produces a current $i_{photo}$ which in turn is added to the DC current which pass through transistors 12 and 12'. The changes in the current affect the current in the base of transistor 24 thereby adjusting the current that flows from resistor 22 through transistor 24 to the constant current source 25. The changes in the current through resistor 22 are directly responsive to the photodiode 10. The current changes through resistor 22 are fed back through the base of transistor 23 controlling the current in resistor 21 ultimately acting as feedback to transistor 24. The value of the resistor 22 provides the load impedance for the circuit producing the output voltage at lead 26. However, the impedance of the shunt-shunt feedback gain circuit itself is substantially lower than it would be with either resistor 21 or 22 alone. It is this separation of the output impedance from the load impedance that provides our circuit with the ability to have high gain while still maintaining a high bandwidth throughput.

Examining the circuit in FIG. 2 in more detail we can see that the new added section of emitter follower in the shunt-shunt feedback gain stage 20 produces an open loop gain $A_0$ which can be expressed as $$A_0 = g_{m,24} R_{22} = \frac{I_0}{V_T} R_{22}$$

with $g_{m,24}$ being the transconductance of the transistor 24 and $R_{22}$ being the value of the load resistor 22.

The performance of this new circuit can be evaluated according to three time constants; $\tau_1$ associated with node 15, $\tau_2$ associated with node 16, and $\tau_3$ associated with node 17. In general, time constant $\tau_3$ can be neglected since both the resistance and capacitance are small compared to the values at nodes 15 and 16. At node 15 $\tau_1$ equals $(1/g_m)(C_{be,12} + 2C_{diode})$ and $\tau_2$ equals $R_{21} C_{bc,24} + (R_{21}/(1+A_o)) C_{bc,12}$ where $A_o$ is the open loop gain and equals $A_o = (I_{25} R_{22})/2kT$. Therefore, the new effective $-3$ dB frequency is depicted by $$f_{-3dB,new} = \frac{1}{2\pi(\tau_1 + \tau_2)} =$$

-continued $$\frac{1}{2\pi\left(\frac{C_{be,12} + 2C_{diode}}{g_{m,12}} + \left(R_{21}C_{bc,24} + \frac{R_{21}}{1+A_o}C_{bc,12}\right)\right)}$$

where $C_{bc,24}$ is the base-collector capacitance for transistor 24 and $C_{bc,12}$ is the base-collector capacitance for transistor 12. Therefore, the effective output impedance is reduced by the value of the open loop gain $A_0$ of the shunt-shunt feedback amplifier 20 and 20′.

Figure 3:
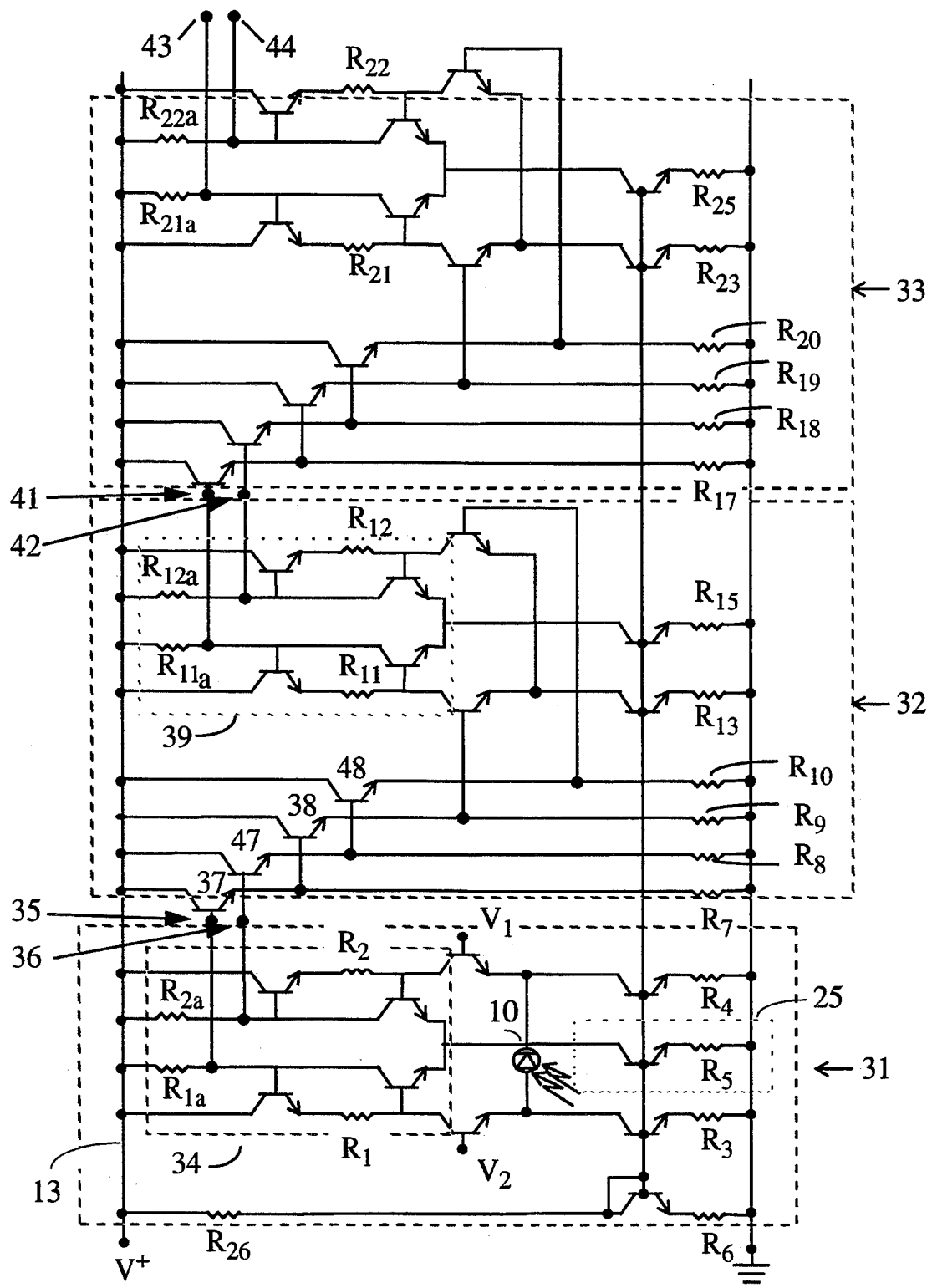
FIG. 3 illustrates an embodiment of our inventive circuit with the post amplifier comprising two cascadable shunt-shunt feedback amplifiers.

It is an additional aspect of our invention to add an integrated two stage post amplifier that provides a 100 dB of amplification to the output of our new differential amplifier structure. The Chang et al. circuit described in U.S. Pat. No. 5,130,667 achieved its bandwidth performance with unity gain. In order to drive conventional data regeneration circuits, the output power of the differential amplifier had to be increased. Increasing the gain required an increase in the value of the output load resistor. In the circuit disclosed in U.S. Pat. No. 5,130,667, an increase in the output load resistor reduced the bandwidth. Our shunt-shunt feedback stage as disclosed above allows for an increase in the gain without affecting the bandwidth performance of the circuit. However, the gain may not be sufficient to drive some conventional decision circuits. FIG. 3 depicts a further implementation of our optical receiver circuit with an integrated two stage post amplifier.

Our differential transimpedance amplifier circuit 31 with a shunt-shunt feedback gain stage 34 receives optical input at the photodiode 10 and provides a complementary voltage output at nodes 35 and 36. The complementary voltage output is input to the first stage level shifting post amplifier 32. The level shifting post amplifier 32 provides power amplification while maintaining the complementary voltage output without impacting bandwidth performance. The voltages at nodes 35 and 36 are stepped through two transistors each to increase the overall power. For example, the voltage at node 35 controls the current flowing through transistor 37 which in turn drives transistor 38. The output of transistor 38 is input to another differential transimpedance amplifier circuit with a shunt-shunt feedback gain stage shown as 39. Similarly, the output voltage at node 36 is stepped through two transistors 47 and 48 and also provided as input to the other side of the differential transimpedance amplifier circuit 39. The first stage post amplifier 32 produces complementary voltage output at nodes 41 and 42 equivalent to the voltage output at nodes 35 and 36 but with greater power to drive the next circuit 33. Our post amplifier design mimics the use of our differential transimpedance amplifier with a shunt-shunt feedback gain stage in order to provide the necessary gain at very high speeds. The second post amplifier stage 33 operates similarly to post amplifier stage 32 to produce a complementary voltage output at nodes 43 and 44 with sufficient power without any loss in bandwidth performance.

In this embodiment, because the output of the transimpedance amplifier circuit 31 drives an emitter follower stage 32, the values of $C_L$ and $C_{bc,12}$ and $C_{bc,24}$ are roughly equal. Therefore, $\tau_2$ is reduced to $(1+1/(1+A_o))C_{bc,24}R_{21}$ and with $A_o$ much larger than 1, $\tau_2$ is further reduced to $R_1C_{bc,24}$. The bandwidth improvement of our transimpedance amplifier with a cascadable multistage post amplifier can therefore be approximated by $$\frac{f_{-3dB,new}}{f_{-3dB,old}} = \frac{\frac{C_{be,12} + 2C_{diode}}{g_{m,12}} + 2R_{21}C_{bc,24}}{\frac{C_{be,12} + 2C_{diode}}{g_{m,12}} + \left(1 + \frac{1}{1+A_o}\right)R_{21}C_{bc,24}}$$

For example, with $g_{m12}=4.6\times10^{-2}$ siemens $C_{be,12}=$ to 0.125 pF, $C_{diode}=1$ pF $C_{bc,24}=10$ fF $R_{21}=400\Omega$, $I_{25}=1.2$ mA, and $R_{22}=600\Omega$, then $f_{-3dB,old}=10.4$ GHz and $f_{-3dB,new}=14.7$ GHz which is a 41% improvement.

In a specific implementation of our invention, all the transistors used where AlGaAs/GaAs Heterojunction Bipolar Transistors manufactured by Rockwell International with 1.4 micron emitter size. In this implementation, the values of the resistors are as follows: $R_1=400$ $\Omega$; $R_2=400$ $\Omega$; $R_{1a}=600$ $\Omega$; $R_{2a}=600$ $\Omega$; $R_3=1$ K $\Omega$; $R_4=1$ K $\Omega$; $R_5=500$ $\Omega$; $R_6=1$ K $\Omega$; $R_7=6$ K $\Omega$; $R_8=6$ K $\Omega$; $R_9=6$ K $\Omega$; $R_{10}=6$ K $\Omega$; $R_{11}=400$ $\Omega$; $R_{12}=400$ $\Omega$; $R_{11a}=600$ $\Omega$; $R_{12a}=600$ $\Omega$; $R_{13}=500$ $\Omega$; $R_{15}=500$ $\Omega$; $R_{17}=6$ K$\Omega$; $R_{18}=6$ K$\Omega$; $R_{19}=6$ K$\Omega$; $R_{20}=6$ K$\Omega$; $R_{21}=400$ $\Omega$; $R_{22}=400$ $\Omega$; $R_{21a}=600$ $\Omega$; $R_{22a}=600$ $\Omega$; $R_{23}=500$ $\Omega$; $R_{25}=500$ $\Omega$; and $R_{26}=6$ K$\Omega$. With the component values as described, the circuit provides 100 dB $\Omega$ gain at 18 GHz.

Clearly, those skilled in the art recognize that the principles that define our circuit structure are not limited to the embodiment illustrated herein. Other embodiments may be readily devised by those skilled in the art. For example, one can use a field-effect transistor to replace the bipolar transistors depicted in the disclosure above. One could also replace the p-i-n photodetector with other photodetectors such as metal-semiconductor-metal (MSM) photodetectors or may even replace the photodetector with any high speed signal detector.

We claim:

1. A high speed optical receiver circuit including a differential amplifier circuit, said differential amplifier circuit having a structure comprising a first and second current path connected between two DC biasing sources, each of said current paths including an input transistor, a load resistor, and a second transistor connected in series, each of said input and second transistors having an emitter, a base, and a collector, said circuit comprising:

a photodiode connected between said emitters of said input transistor with the bases of said input transistors biased at different levels, a pair of shunt-shunt feedback gain circuits each comprising a second resistor and a third transistor connected in series and each associated with one of said current paths, each of said third transistors having an emitter, a base, and a collector, the base of each of said second transistors being connected to said second resistor and the collector of said third transistor of the associated shunt-shunt feedback gain stage, and the base of each third transistor being connected to said load resistor and the collector of said input transistor of the associated one of said current paths; and an output node connected to said base of at least one of said second transistors.

2. The high speed optical receiver circuit in accordance with claim 1 further comprising a level shifting post amplifier connected to said output node.

3. The high speed optical receiver circuit in accordance with claim 2 wherein said level shifting post amplifier circuit comprises:
    level shifter connected to each output node followed by an amplifier means.

4. The high speed optical receiver circuit in accordance with claim 3 wherein said amplifier means is a differential amplifier circuit of the same structure as said differential amplifier circuit included in said high speed optical receiver circuit.

5. A high speed optical receiver comprising:
    a differential transimpedance amplifier having two input transistors with the bases of the input transistors biased at different levels;
    a photodiode biased between the emitters of the two input transistors;
    shunt-shunt feedback gain means for providing transimpedance gain and providing an output impedance reduced by the value of the open loop gain of said shunt-shunt feedback gain means; and
    two output nodes at which complementary voltage outputs are produced responsive to the current induced by said photodiode.

6. A high speed optical receiver in accordance with claim 5 wherein said shunt-shunt feedback gain means comprises:
    a second transistor and a first resistor connected in series with said input transistor in each of the current paths in said differential transimpedance amplifier circuit whereby said first resistor provides transimpedance gain; and
    a pair of circuit means each comprising a second resistor and a third transistor in series and each connected in parallel with one of said current paths of said amplifier such that said second resistor functions as the load resistor of said differential amplifier and where the impedances of said pair of circuit means provide the output impedance of the differential amplifier.

7. A high speed optical receiver in accordance with claim 5 further comprising:
    a level shifting two stage post amplifier circuit connected to and receiving input from said two output nodes.

8. A high speed optical receiver in accordance with claim 7 wherein each stage of said two stage post amplifier circuit comprises;
    two two-transistor level shifting circuits, one each connected to each of the output nodes; and
    a differential transimpedance amplifier circuit with a shunt-shunt feedback gain stage with the input being the output from said two level shifting circuits and providing a complementary voltage output.

9. A high speed receiver circuit comprising:
    a differential transimpedance amplifier circuit having a pair of input transistors with the bases of said input transistors biased at different levels;
    a signal detector coupled to and biased between the emitters of said input transistors; and
    output impedance means connected to each of said input transistors, said output impedance means comprising a shunt-shunt feedback gain circuit having a feedback stage and output load stage.

10. A high speed receiver circuit in accordance with claim 9 further comprising:
    an integrated two stage level shifting post amplifier circuit receiving as input the output from said differential transimpedance amplifier circuit with a shunt-shunt feedback gain stage and producing a complementary voltage output with power gain.

11. A high speed receiver circuit in accordance with claim 10 wherein said integrated two stage level shifting post amplifier circuit comprises a second differential transimpedance amplifier circuit with a shunt-shunt feedback gain circuit identical in structure with said first mentioned differential transimpedance amplifier.

* * * * *